US012796385B2

(12) United States Patent
Keigler et al.

(10) Patent No.: US 12,796,385 B2
(45) Date of Patent: Nov. 10, 2026

(54) CLEAN WORKPIECE LOADER AND EDGE PROTECTION HOLDER FOR WET CHEMICAL SEMICONDUCTOR PROCESSING

(71) Applicant: ASMPT NEXX, Inc., Billerica, MA (US)

(72) Inventors: Arthur Keigler, Billerica, MA (US); Freeman Fisher, Billerica, MA (US); David G. Guarnaccia, Billerica, MA (US); Daniel L. Goodman, Billerica, MA (US); Dennis Graham, Billerica, MA (US)

(73) Assignee: ASMPT NEXX, Inc., Billerica, MA (US)

( * ) Notice: Subject to any disclaimer, the term of this patent is extended or adjusted under 35 U.S.C. 154(b) by 351 days.

(21) Appl. No.: 18/655,663

(22) Filed: May 6, 2024

(65) Prior Publication Data

US 2025/0343063 A1 Nov. 6, 2025

(51) Int. Cl.
*H10P 72/30* (2026.01)
*C25D 17/06* (2006.01)
(Continued)

(52) U.S. Cl.
CPC .......... *H10P 72/3302* (2026.01); *C25D 17/06* (2013.01); *C25D 17/28* (2013.01); *H10P 72/0404* (2026.01); *H10P 72/7602* (2026.01); *H10P 72/7606* (2026.01); *H10P 72/7608* (2026.01)

(58) Field of Classification Search
CPC ............. H10P 72/3302; H10P 72/0404; H10P 72/7602; H10P 72/7606; H10P 72/7608; H10P 14/47; H10P 72/0411; H10P 72/0422; H10P 72/7616; C25D 17/06; C25D 17/28; C25D 7/12; C25D 17/001; C25D 21/00; C25D 17/007
See application file for complete search history.

(56) References Cited

U.S. PATENT DOCUMENTS

| | | | |
|---|---|---|---|
| 10,283,396 | B2 | 5/2019 | Keigler et al. |
| 11,608,563 | B2 | 3/2023 | Keigler et al. |

(Continued)

FOREIGN PATENT DOCUMENTS

| | | | |
|---|---|---|---|
| JP | 2018104781 | A | 7/2018 |
| JP | 2019522114 | A | 8/2019 |

(Continued)

OTHER PUBLICATIONS

Office Action from Japanese Patent Application No. 2025-076926, dated Jul. 7, 2026.

*Primary Examiner* — Jeffrie R Lund
(74) *Attorney, Agent, or Firm* — Patterson + Sheridan, LLP

(57) ABSTRACT

An apparatus for loading and transport of fragile flexible workpieces for use in wet chemical semiconductor processing is described. A loader aligns a workpiece in a frame while maintaining minimal physical contact. A holder precisely positions at least two edges of the workpiece, while providing workpiece edge protection and straightening on the remaining two edges. The holder allows fluid processing of both faces of the workpiece while allowing a shield or agitation plate to be positioned close to the faces of the workpiece.

16 Claims, 16 Drawing Sheets

(51) Int. Cl.

| | |
|---|---|
| ***C25D 17/28*** | (2006.01) |
| ***H10P 72/00*** | (2026.01) |
| ***H10P 72/76*** | (2026.01) |

(56) References Cited

U.S. PATENT DOCUMENTS

| | | | | |
|---|---|---|---|---|
| 11,887,874 | B2 | 1/2024 | Keigler et al. | |
| 2006/0289302 | A1 * | 12/2006 | Hanson | C25D 17/00 204/297.06 |
| 2017/0372937 | A1 * | 12/2017 | Keigler | C25D 17/001 |
| 2022/0148891 | A1 | 5/2022 | Keigler et al. | |
| 2023/0130419 | A1 * | 4/2023 | Solari | C25D 17/00 134/1.3 |
| 2025/0343063 | A1 * | 11/2025 | Keigler | H10P 72/3302 |
| 2026/0114224 | A1 * | 4/2026 | Keigler | H10P 72/0416 |

FOREIGN PATENT DOCUMENTS

| | | | | |
|---|---|---|---|---|
| JP | 202195591 | A | 6/2021 | |
| WO | WO-2007002656 | A2 * | 1/2007 | C25D 17/005 |
| WO | WO-2022149257 | A1 * | 7/2022 | C25D 7/123 |

* cited by examiner

CLEAN WORKPIECE LOADER AND EDGE PROTECTION HOLDER FOR WET CHEMICAL SEMICONDUCTOR PROCESSING

This invention relates to methods and systems for wet chemical semiconductor processing such as cleaning, etching and electroplating of semiconductor substrates for advanced packaging or high-density-interconnect applications. More specifically, this invention relates to systems and methods for clean handling, transport and protection of thin fragile substrates for use in wet chemical processes including electro-chemical deposition.

BACKGROUND AND PRIOR ART

Electro-chemical deposition is used as a manufacturing technique for the application of thin films to semiconductor substrates including semiconductor wafers and rectangular panels. Films can include copper, tin, nickel, cobalt-iron, indium and other metals. During electrochemical deposition current flows from an anode through a plating bath to the cathode. When a substrate is used as the cathode, metal can be deposited thereon.

Advanced packaging involves interconnection of components before applying traditional integrated circuit packaging processes. Advanced packaging allows multiple devices to be merged and packaged as a single electronic device. Rectangular substrate panels are one type of advanced packaging substrate which provide manufacturing and cost advantages, allowing large and complex systems to be built up on the panel substrate. Rectangular substrate panels are typically manufactured as organic laminates consisting of glass fiber reinforcement in an epoxy composite matrix, a composition similar to printed circuit boards.

High purity glass has important advantages over organic laminates as a rectangular panel substrate base material. Advantages include dimensional stability and a thermal expansion coefficient similar to silicon, both of which are important for heterogeneous integration applications. Direct bonding of die to glass improves thermal performance compared with organic laminates. Pure glass as a panel substrate also permits the filling of through glass vias using electroplating.

Although glass has process advantages when used as a substrate, it is also a brittle ceramic which can fracture if not properly handled. Cracks in ceramics including glass typically propagate from an edge defect caused by surface contact or a localized stress. Cracks and breakage can also occur if an edge is bent beyond a thickness-dependent threshold angle.

Glass substrates for panels may be quite thin, with typical starting thicknesses before buildup of 200-400 μm. Thin glass substrates demonstrate a significant sag due to gravity when held horizontally from their edges. When held vertically, thin glass substrates may be bowed due to unbalanced intrinsic stress in deposited layers.

Workpiece holders are used for transport of substrates through wet-processing tools. When used in electroplating tools, workpiece holders also provide electrical contact during electroplating. Electrical contact with the workpiece or substrate typically occurs on faces in an edge region where the holder's metal contacts are in physical contact with a metal seed layer on the workpiece face. This contact area needs to be kept dry to avoid metal buildup on the contacts as well as seed deplating due to localized galvanic cells. Therefore, an important function of the holder is to seal the contact area, preventing electroplating solution from wetting the electrical contacts and seed layer.

Workpiece holders for wet-processing steps such as chemical etch, photoresist strip and cleaning must provide secure support of the substrate, typically in a vertical orientation in a wet chemical process module, with minimal physical contact to the workpiece so that the chemical removal process is not blocked by the workpiece holder surfaces securing the substrate.

After processing, the workpiece holder is removed from processing baths and transported to the next processing step. Some processing fluid is transported with the frame and workpiece—this fluid is known as "drag-out." Minimizing drag-out is an important design goal for workpiece holders.

Thin, flexible glass workpieces require careful handling during loading into and out of holders to maintain cleanliness during insertion into the holder. To prevent the introduction of particle contamination, physical contact with the workpiece is restricted to narrow zones outside of the device areas on the workpiece. These allowed contact areas are referred to as 'Keep Out Zones' (KOZ). During all handling steps, from removal of workpiece from its factory transport carrier, commonly referred to as a FOUP (front-end opening unified pod), the processing equipment should only contact the workpiece in the KOZ.

Holders for wet semiconductor processing of rectangular workpieces may contact and/or constrain two, three or four edges of the workpiece, and for vertical processing typically there is contact on both front and back faces of the workpiece. Prior art holders have various limitations addressed by the present invention.

A known electroplating system, in which a workpiece holder is used which contacts and constrains only two edges, i.e. opposing edges, of a workpiece is described with reference to FIGS. 1 to 4.

FIG. 1 schematically shows a known electroplating tool 50 as described in U.S. Pat. No. 11,887,874 and incorporated herein by reference. Electroplating tool 50 comprises an input/output module 51, a loader/unloader module 52, workpiece holder storage module 53, process modules 54-58, close patterning shield storage module 59, transporter support area 65, maintenance support area 66, electrical and chemical systems area 67, and a workpiece holder cleaning module 68. Tool 50 is a single-ended tool with unprocessed workpieces introduced into the tool and processed workpieces removed from the tool in the same input/output front-end module 51. Input/output front-end module 51 comprises one or more front opening unified pods (FOUP) 69, and an equipment font end module (EFEM) robot 70 which transports workpieces between input/output module 51 and loader/unloader module 52.

Although FIG. 1 shows five process modules, tool 50 may have any number of process modules depending on the exact process to be performed, such as the number of different metals to be electroplated, the number of pre- and post-plating processes and the number of duplicate modules used in parallel to increase tool throughput.

Workpiece holder storage module 53 is used to store workpiece holders 100 when they are not in use. A local transporter (not shown) transfers workpiece holders 100 from storage area 53 to loader/unloader 52 to bring them into service. Transporter support area 65 provides mechanical, electrical and fluid support to two or more transporters which overhang loader/unloader 52, process modules 54-58 and CPS storage area 59. Electrical and chemical systems area 67 house power distribution systems and fluid handling systems for all other modules. Maintenance support area 66 allows support personnel access to equipment in the electrical and chemical systems area 67 and to all electrical and fluid connections in the process modules 54-58. Workpiece holder cleaning module 68 comprises equipment for cleaning the workpiece holders 100 when they are not being used for processing workpieces.

The processing flow for an unprocessed workpiece in tool 50 begins with its transfer, by an EFEM robot 70, from the input/output module 51 to the loader/unloader module 52 where the workpiece 60 (not shown) is loaded into a workpiece holder. The loaded workpiece holder is then transported using a transportation mechanism to a series of preprocessing modules 54-55 for wet processing steps such as pre-cleaning, pre-rinsing, and chemical activation. The loaded workpiece holder 100 is then transported to either of process modules 56 or 57 for electroplating. After electroplating, the loaded workpiece holder 100 is transported to process module 58 for further processing steps such as final rinsing and drying. Following final rinsing and drying, the loaded workpiece holder 100 is transported to the loader/unloader module 52 where the workpiece W is unloaded from the workpiece holder 100. The processed workpiece W is then transferred to the input/output module 51 for storage until all the workpieces in the current batch have been processed.

FIG. 2 shows a known two-sided workpiece holder 100 for use in electroplating, for example to transport workpieces between processing modules in electroplating tool 50. Workpiece holder 100 is described in detail in U.S. Pat. No. 10,283,396 and incorporated by reference. Workpiece holder 100 is formed as a frame including a header member 107 configured to be gripped and transported to and from a processing cell. Lateral supports 111 and 112 extend from the ends of header member 107. Contact seal strips 121 and 122 are attached along the length of lateral supports 111 and 112. When in use, the inner edge of flexible contact seal strips 121 and 122 contact opposite faces of a workpiece to provide a fluid seal and electrical contact in the KOZ region of the workpiece (see below).

FIG. 3 shows a bottom view of part of the workpiece holder 100 and contact seal strip 122 with an elongated actuation member 144 inserted. Contact seal strip 122 comprises electrical contacts 125 and 126 located at the ends of respective flexing grippers 123, 124. The flexing grippers 123, 124 take the form of thin, flexible sheets, having a resiliently deformable electrically conductive center, integrally formed with electrical contacts 125, 126, surrounded and sealed by compliant insulators 131, 132 respectively. The flexing grippers 123, 124 are biased into a closed configuration in which they are relatively close together (as shown in FIG. 4 below). The actuation member 144 comprises a bladder 146, which can be inflated using a pneumatic control (not shown) to extend and separate a pair of arms 147 arranged one on each side of the bladder 146. The arms 147 are biased into a closed configuration in which they are relatively close together (as shown in FIG. 4 below). Respective arms 147 engage with respective inner surfaces of flexing grippers 123, 124. FIG. 3 shows the bladder 146 in an inflated configuration, with arms 147, and hence flexing grippers 123, 124 correspondingly pushed apart, allowing insertion of workpiece 60.

FIG. 4 shows a view similar to that of FIG. 3, of the workpiece holder 100 and contact seal strip 122 with the bladder 146 in an uninflated configuration. When bladder 146 is uninflated, flexing grippers 123, 124 provide gripping force to the workpiece 60 such that the faces of workpiece 60 are in respective electrical contact with electrical contacts 125 and 126. In this configuration, compliant insulators 131 and 132 provide a fluid seal, preventing fluid from wetting contacts 125 and 126. Also shown in FIG. 4 is a close patterning shield 70 with aperture openings 71. When positioned at a proper focal distance to workpiece 60, close patterning shield 70 provides improved uniformity of patterned features electroplated on workpiece 60.

Details of workpiece holder 100 and contact seal strips 121 and 122 are described in U.S. Pat. No. 10,283,396 assigned to the current applicant and incorporated in their entirety. Details of close patterning shield 70 and its use are described in U.S. Pat. No. 11,608,563 assigned to current applicant, as well as in US Pat. Publication US20220148891A1, both incorporated in their entirety.

For other wet processing applications, instead of contact seal strips a similar flexure structure may be used which only contacts the substrate faces in the KOZ region without providing electrical current, for example the flexing grippers may be entirely fabricated from a plastic such as PEEK.

It has been argued that holders which secure only two edges of rectangular substrates, such as the workpiece holder 100 described above, as well as alternatives (not shown) which secure three edges, risk substrate breakage if an unprotected workpiece edge contacts a processing module surface, with such contact being more likely for thin, bowed workpieces. Four-sided frame holders which protect workpieces' edges against such contact have therefore been developed, but it has been found that such holders have deficiencies which negate perceived improvements, as discussed below.

Known four-sided frame holders are typically constructed with a front frame which presses the workpiece edge against a backing plate or a back frame. An actuated mechanical or magnetic locking, or vacuum mechanism, may clamp the front and back portions of the frame. Such a configuration may allow plating of only one side of the workpiece. Furthermore, the actuated mechanical, magnetic or vacuum locking mechanisms of known four-sided frames may utilize O-rings as fluid seals. Over time, it is common for such seals to leak, and subsequent chemical fluid ingress contaminates the electrical contacts and locking mechanism with plating bath chemistry, damaging components with acidic chemistry and requiring extensive cleanup.

In addition, the front frames of such known four-sided frame holders may be too thick to allow placement of either electric field uniformity shields or fluid agitation plates sufficiently close to the workpiece. Close positioning shields, which include patterns of apertures which correspond to target positions on the workpiece as described in U.S. Pat. No. 11,608,563, are used in electroplating to improve the uniformity of features plated on the workpiece. Agitation plates are used to increase plating, stripping or etching rates by uniformly increasing the transport of processing chemistry constituents to the workpiece face. Close positioning shields and agitation plates both need to be placed within a few millimeters of the workpiece, which has not been possible using known four-sided frame holders.

It is an aim of the present invention to provide a workpiece holder that overcomes the limitations of such known workpiece frame holders for wet chemical processing, including electroplating, while improving plating uniformity, protecting fragile rectangular workpieces on all four edges, and permitting shields to be placed within a few mm on both faces of the workpiece. The design uses neither locking clamps nor O-rings, eliminating the risks of frame holder internal contamination due to fluid leaks. A semiconductor processing apparatus for use with such a workpiece holder includes a loader which supports and constrains the workpiece during insertion into the holder with face KOZ contact consistent with high cleanliness requirements.

SUMMARY OF THE INVENTION

In accordance with a first aspect of the invention there is provided a workpiece holder for holding a substantially planar, quadrilateral workpiece in a processing chamber of a wet semiconductor processing system, the workpiece holder being adapted for insertion into and removal from the processing chamber while holding the workpiece, wherein the workpiece holder comprises:

- first and second lateral supports,
- first and second flexing grippers arranged at respective first and second lateral supports, the flexing grippers movable between a closed configuration in which they contact and restrain respective first and second opposing edges of the workpiece in use, and an open configuration in which the flexing grippers are opened sufficiently to allow the workpiece to be inserted into the flexing grippers in a direction substantially parallel to the first and second lateral supports during a loading operation, and
- an edge protector extending in use between the first and second lateral supports.

In accordance with a second aspect of the present invention there is provided a semiconductor processing system for processing a substantially planar, quadrilateral workpiece while loaded into the workpiece holder of the first aspect, the system comprising:

- a processing chamber for wet chemical etch, cleaning or electrodeposition, and
- a loader for loading the workpiece into the workpiece holder during the loading operation.

Other specific aspects and features of the present invention are set out in the accompanying claims.

BRIEF DESCRIPTION OF THE DRAWINGS

The invention will now be described with reference to the accompanying drawings (not to scale), in which:

For consistency and clarity, like reference numerals will be retained for like components throughout the following description. FIGS. 2 to 8 are shown with nominal cartesian axes A, B and C fixed with respect to the workpiece (or workpiece holder when the workpiece is held therein); these are used consistently throughout these figures to assist with their understanding.

DETAILED DESCRIPTION

Figure 1:
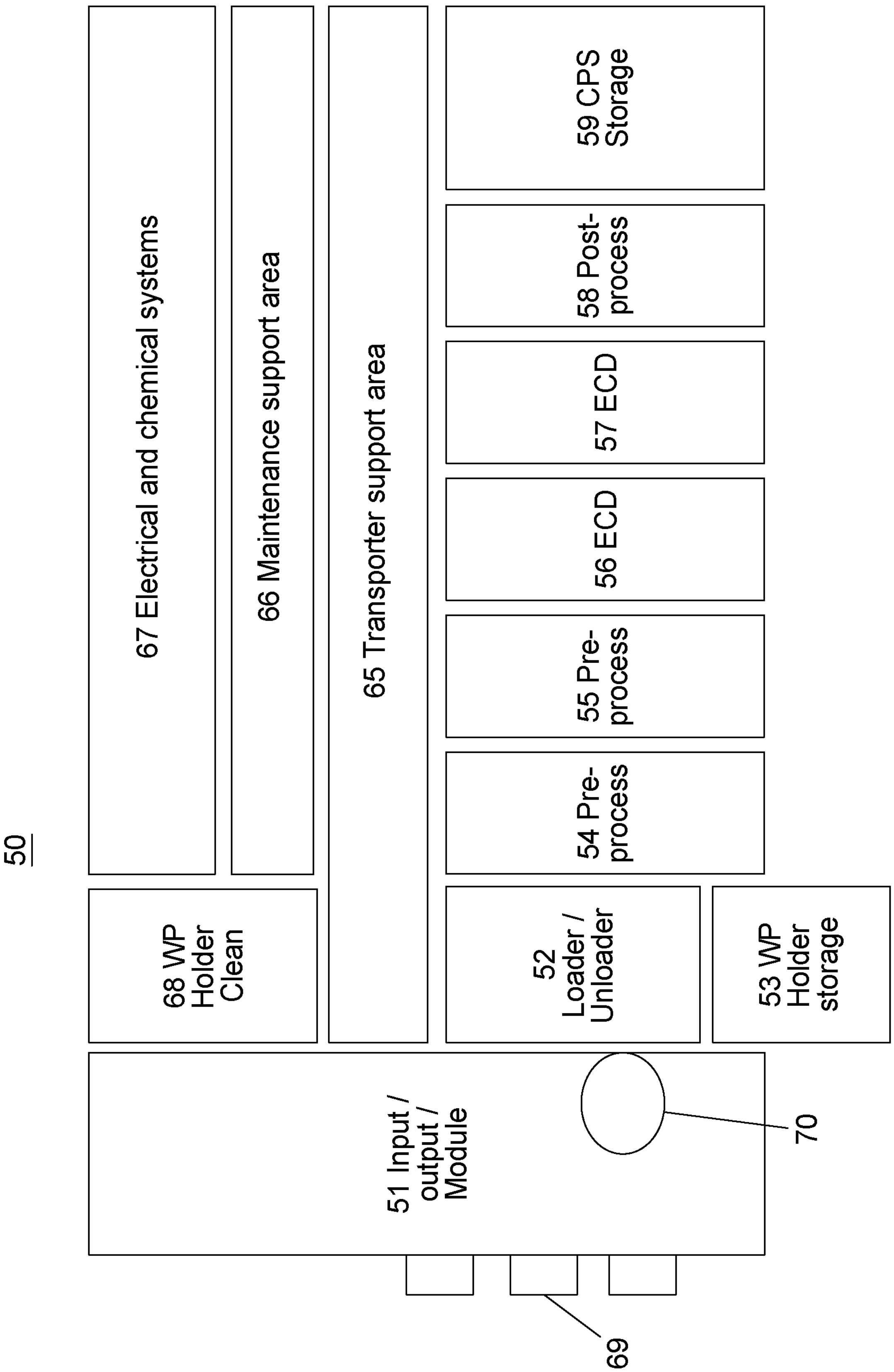
FIG. 1 schematically shows a known electrochemical deposition system.
Figure 2:
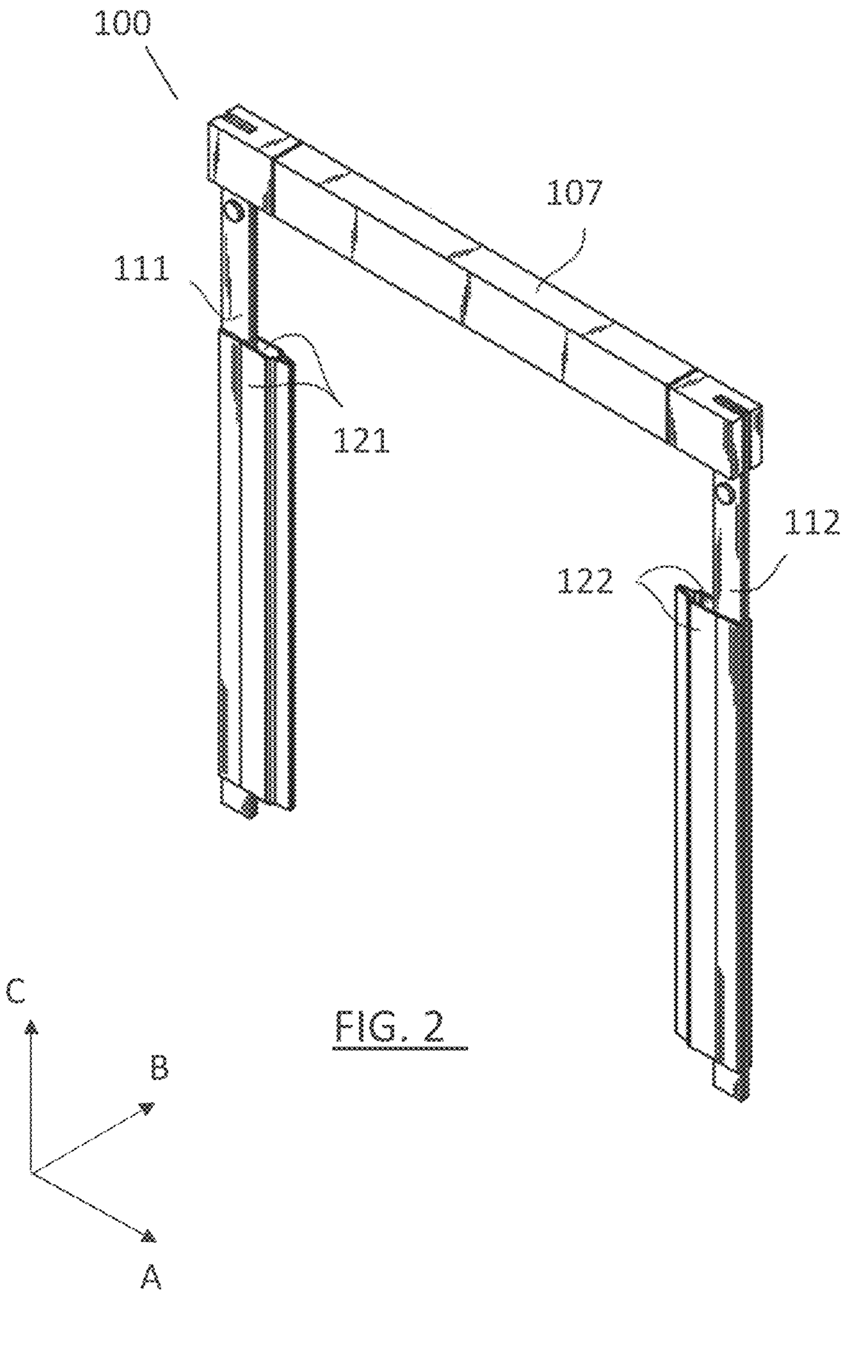
FIG. 2 schematically shows, in perspective view, a known two-sided workpiece holder.
Figure 5:
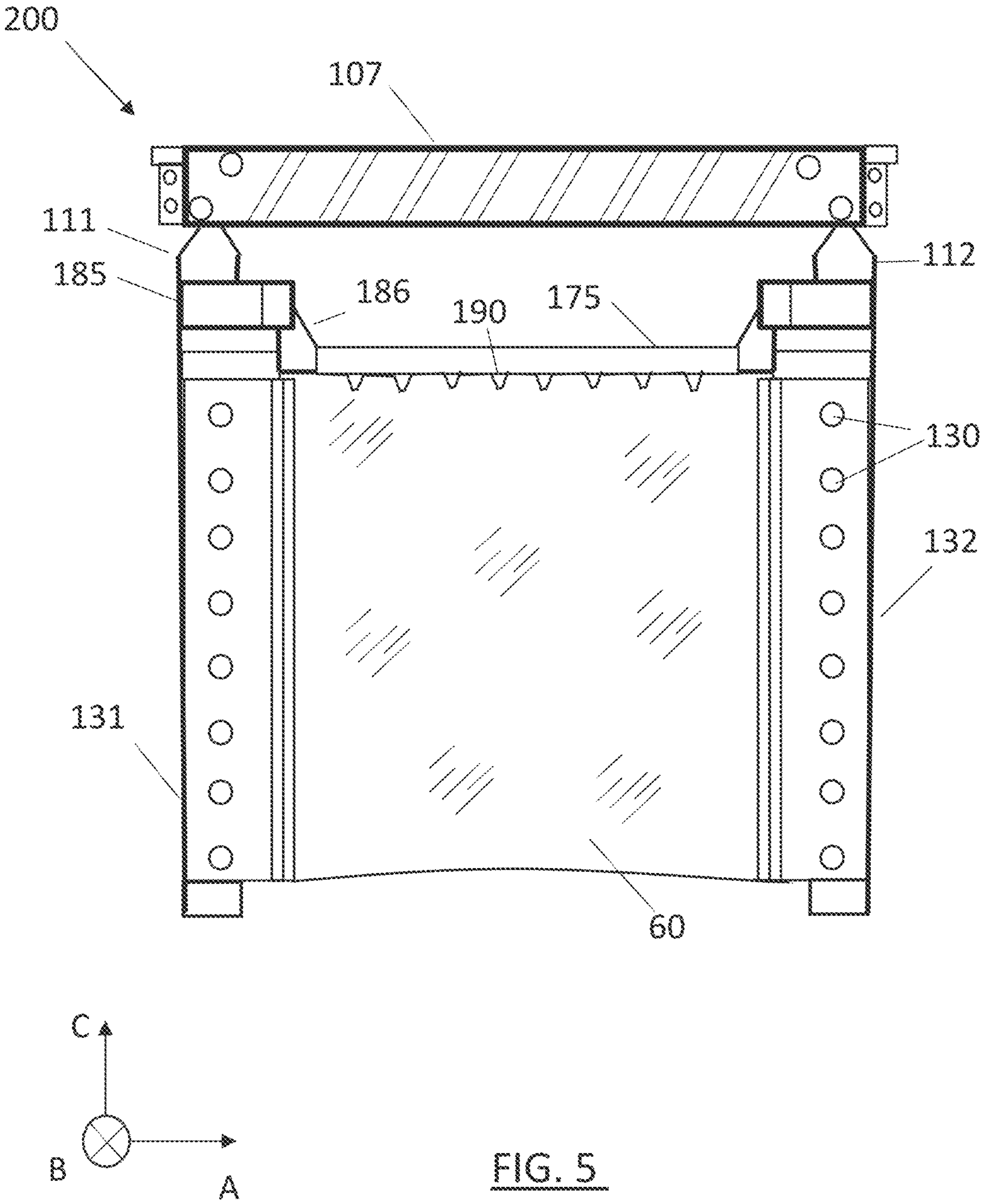
FIG. 5 schematically shows, from the side, a workpiece holder with upper edge protection guide.

FIG. 5 shows a workpiece holder 200 sharing some similarities to that shown in FIG. 2, including a header member 107 which carries lateral supports 111 and 112 at opposing ends thereof, and a respective contact seal strip 121, 122 carried by each lateral support 111, 112. Workpiece holder 200 however includes an upper edge protection guide (EPG) 175 attached to lateral supports 111 and 112 by clamps 185 via supports 186. A workpiece 60 is shown held by the workpiece holder 200, which as shown is bowed. The top edge of the workpiece 60 is held straight, constrained by guide projections 190, 190' (see FIG. 7A) of upper EPG 175. This construction is described in more detail below. The lower edge of the bowed workpiece 60 is unconstrained. Flexing grippers 131 and 132 are attached to lateral supports 111 and 112 via fasteners 130 and flexed open by inflated bladder 146 (not shown). For wet processes requiring electrical contact to the workpiece 60 such as electroplating, contact seal strips 121 and 122 may be used for flexing grippers 131 and 132. For wet processes not requiring electrical contact, such as etching or cleaning, the flexing grippers 131 and 132 may for example comprise spring members over-molded with compliant insulating material, or be fabricated from a rigid plastic material such as PEEK. Flexing grippers 131 and 132 may for example be fabricated from a stainless-steel alloy chosen for high flexural strength and resistance to yield, over-molded with an elastomer such as a fluoroelastomer or a perfluoroelastomer. An elastomer thickness of about 0.5-3 mm may be required to achieve sufficient durability.

Figure 4:
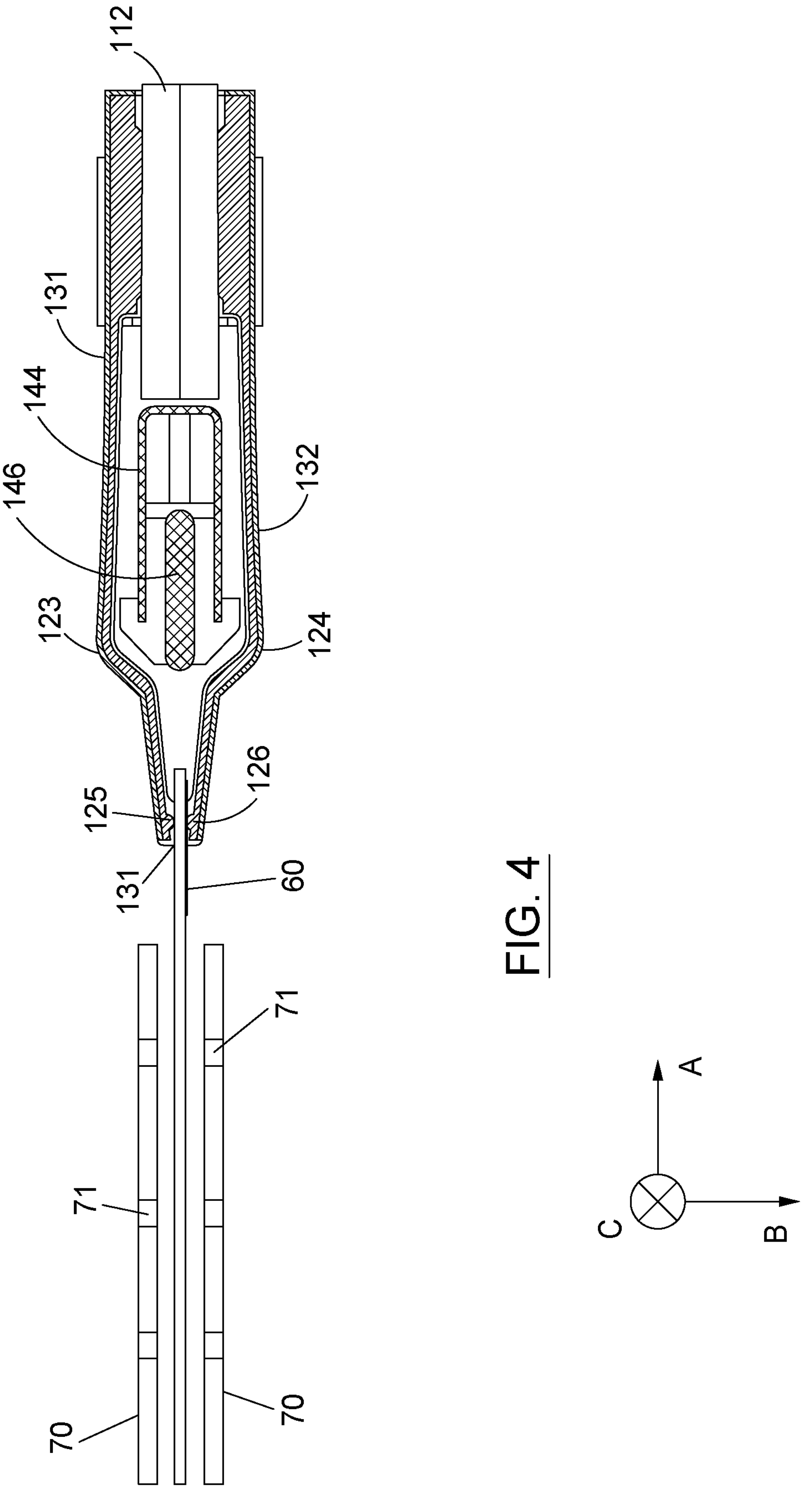
FIG. 4 schematically shows, in sectional view, the workpiece holder of FIG. 2 and a close positioning shield.

In a preferred embodiment, the lateral supports 111, 112, flexing grippers 131, 132 and actuation mechanisms therefor are substantially identical to those previously described with reference to FIGS. 4 and 5, and may have identical crosssections as shown in those figures, and the present invention will be described below assuming that this is the case, using like reference numerals where appropriate for consistency. In this case, opening and closing of the clamps 185 are respectively effected by inflation and deflation of the bladders 146 in a similar manner as opening and closing of the flexing grippers 131, 132.

Figure 3:
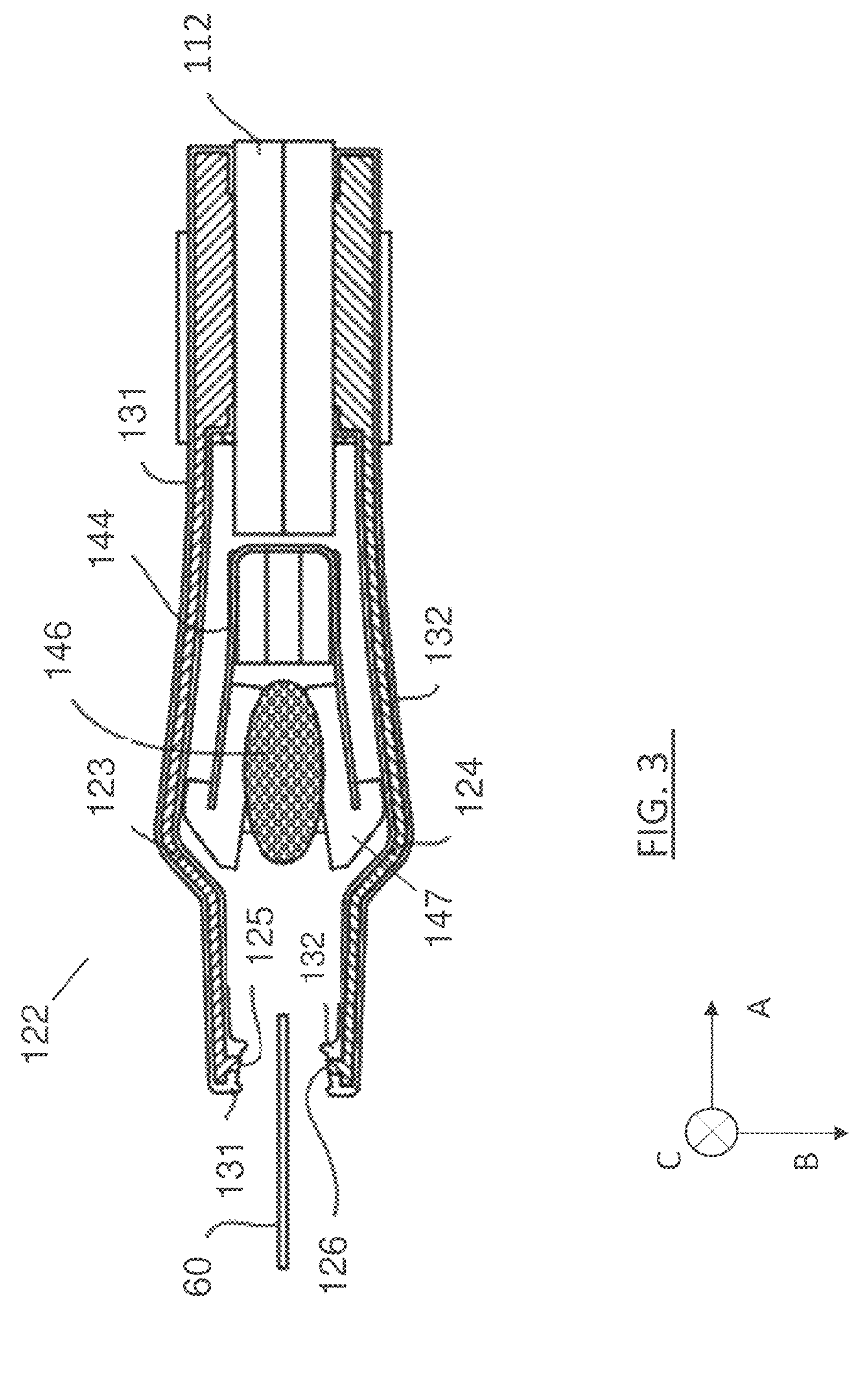
FIG. 3 schematically shows, in sectional view, the workpiece holder of FIG. 2 with elongated actuation member.

The lateral sides of the workpiece 60 are here also unconstrained, since the contact seal strips 121 and 122 are flexed open by an inflated bladder 146, similarly to the arrangement shown in FIG. 3.

The upper EPG 175 may conveniently be assembled with the workpiece holder 200, so that it is permanently or semi-permanently affixed thereto.

Figure 6:
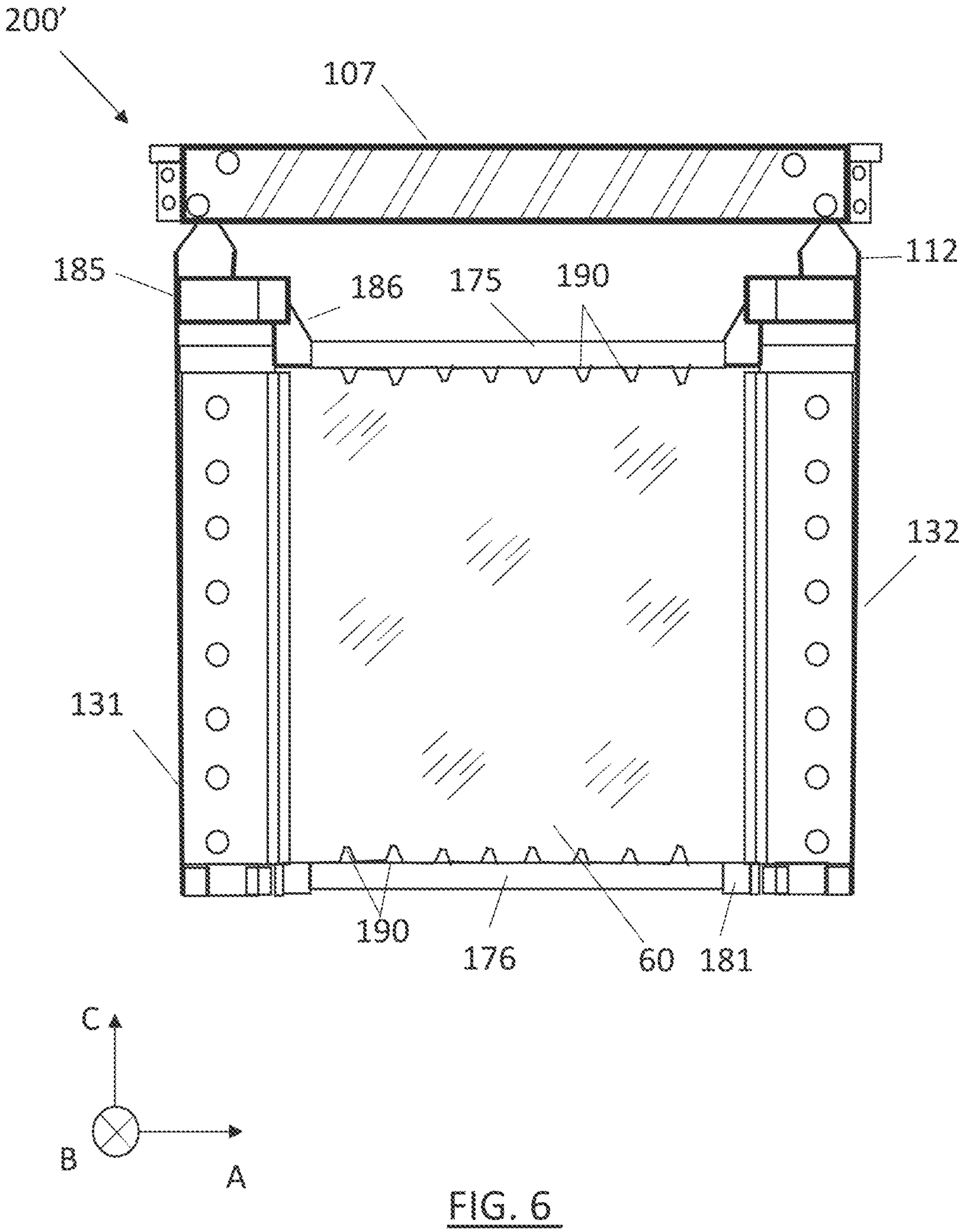
FIG. 6 schematically shows, from the side, a workpiece frame with upper and lower edge protection guides in accordance with an alternative embodiment of the present invention.

FIG. 6 shows an alternative four-sided workpiece holder 200' generally similar to workpiece holder 200 shown in FIG. 5, having an upper EPG 175 attached to lateral supports 111 and 112 by clamps 185 via supports 186, and contact seal strips 121, 122 carried by respective lateral supports 111, 112, but modified in that it also comprises a lower EPG 176 attached to lateral supports 111 and 112 by clamps 181. Opening and closing of the clamps 181 are respectively effected by inflation and deflation of the bladders 146 in a similar manner as opening and closing of the flexing grippers 131, 132. Both the top and bottom edges of workpiece 60 are held straight, constrained by guide features 190, 190' of the upper and lower EPGs 175, 176. In FIG. 6, the contact seal strips 121 and 122 and flexing grippers 131 and 132 act to clamp edges of workpiece 60 after the bladder 146 (not shown) has been uninflated. The upper and lower EPGs 175 and 176 may be fabricated for example from a polymer such as polyetheretherketone or high density polyethylene or from stainless steel with a polymer coating, such as ECTFE (trade name Halar), PTFE or an elastomer such as Viton.

Figure 7A:
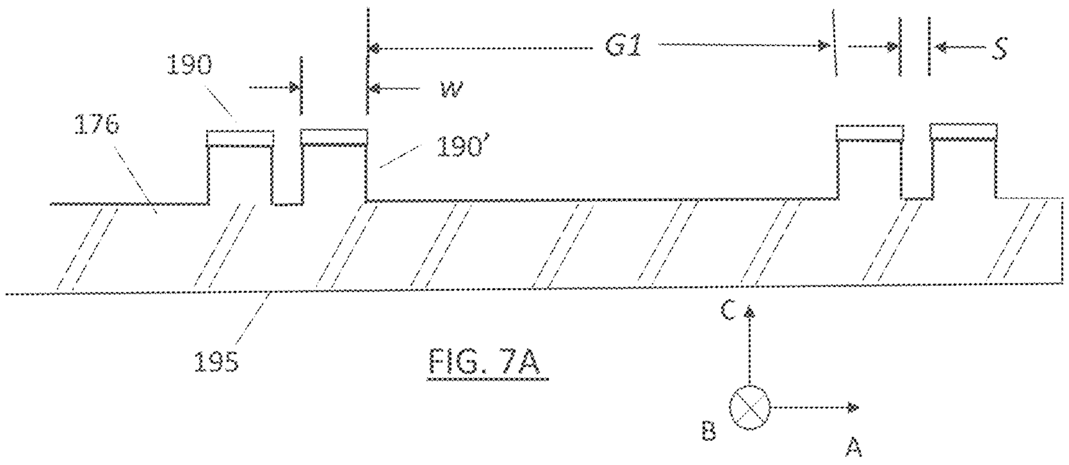
FIGS. 7A, 7B and 7C schematically show, from the side, from above and in section respectively, details of an edge protection guide.

FIG. 7A shows a portion of an EPG, in this case the lower EPG 176, as seen from the side. It should be understood that the upper EPG 175 has a similar construction. EPG 176 comprises a base 195 which supports repeating pairs of guide projections 190 and 190' which project upwardly therefrom. In the horizontal direction parallel to the plane of the workpiece 60, guide projections 190 and 190' have a width w and a cross-sectional spacing S between each guide feature pair. The incorporation of a spacing S may assist in minimizing fluid drag-out after wet chemical processing including etch, cleaning or electrodeposition. Adjacent pairs of guide projections 190 and 190' are spaced apart in the same direction by a gap G1. For a typical workpiece 60 having linear dimensions of 300-1000 mm, the width w may be about 5-15 mm, the cross sectional spacing S may be about 1-5 mm and the gap G1 may be about 30-100 mm.

Figure 7B:
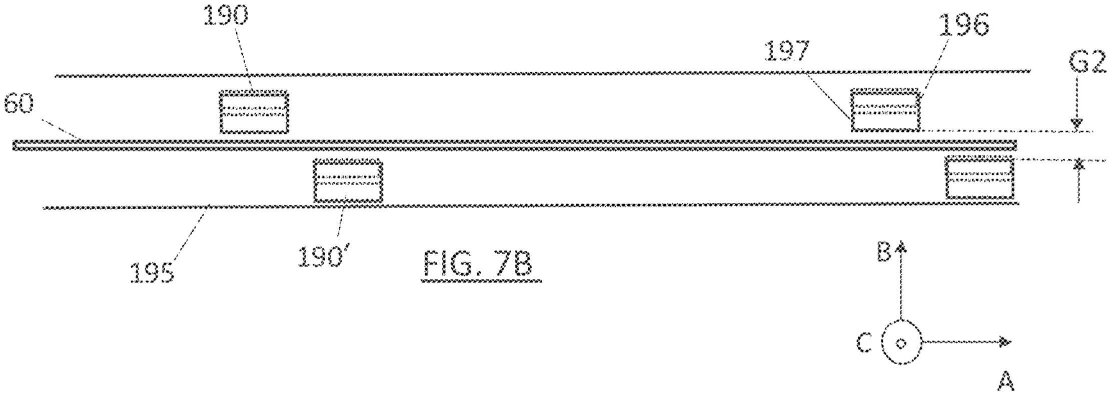

FIG. 7B shows a portion of the lower EPG 176 as seen from above. Guide projections 190 and 190' are spaced a distance G2 apart in the direction normal to the plane of the workpiece 60, chosen to be sufficient to constrain workpiece 60 for insertion into processing cells, while providing sufficient spacing to allow directed high velocity air access to panel edges during a final drying operation. Spacing G2 may be about 0.5-2.5 mm depending on the thickness of the workpiece 60. The guide projections 190, 190' shown are chamfered at their upper ends to provide sloping inner lead-in edges 197 and outer edges 196.

Figure 7C:
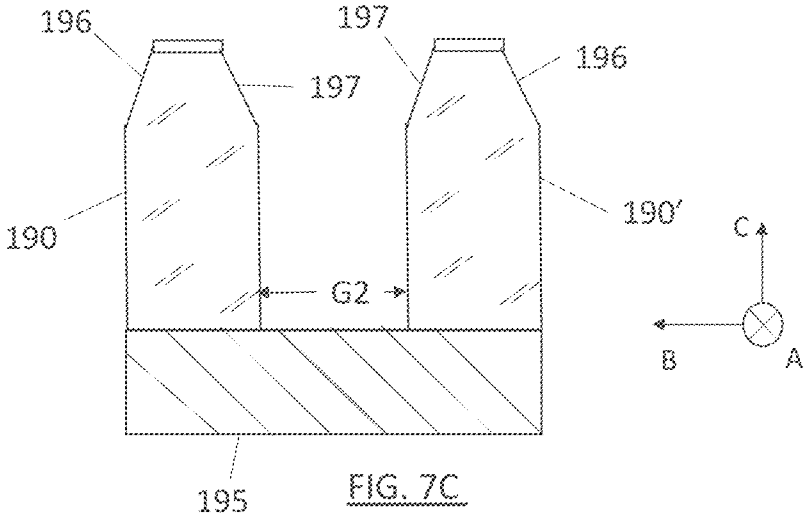

FIG. 7C shows details of guide projections 190 and 190' in section, with the plane of the workpiece 60 orthogonal to the plane of the paper. Here it can be seen that the lead-in edge 197 is sufficiently sloped to guide and capture workpiece edges (not shown) during loading.

It will be appreciated that while upper EPG 175 may, as described above, be attached to the workpiece holder 200, 200' during assembly, it is not possible to so attach the lower EPG 176 (i.e. to convert a workpiece holder 200 to a workpiece holder 200'), since this would obstruct loading of a workpiece into the workpiece holder 200'. Instead, attachment of a lower EPG 176 must be effected subsequent to loading of the workpiece, and a mechanism for achieving this is described later below.

Figure 8:
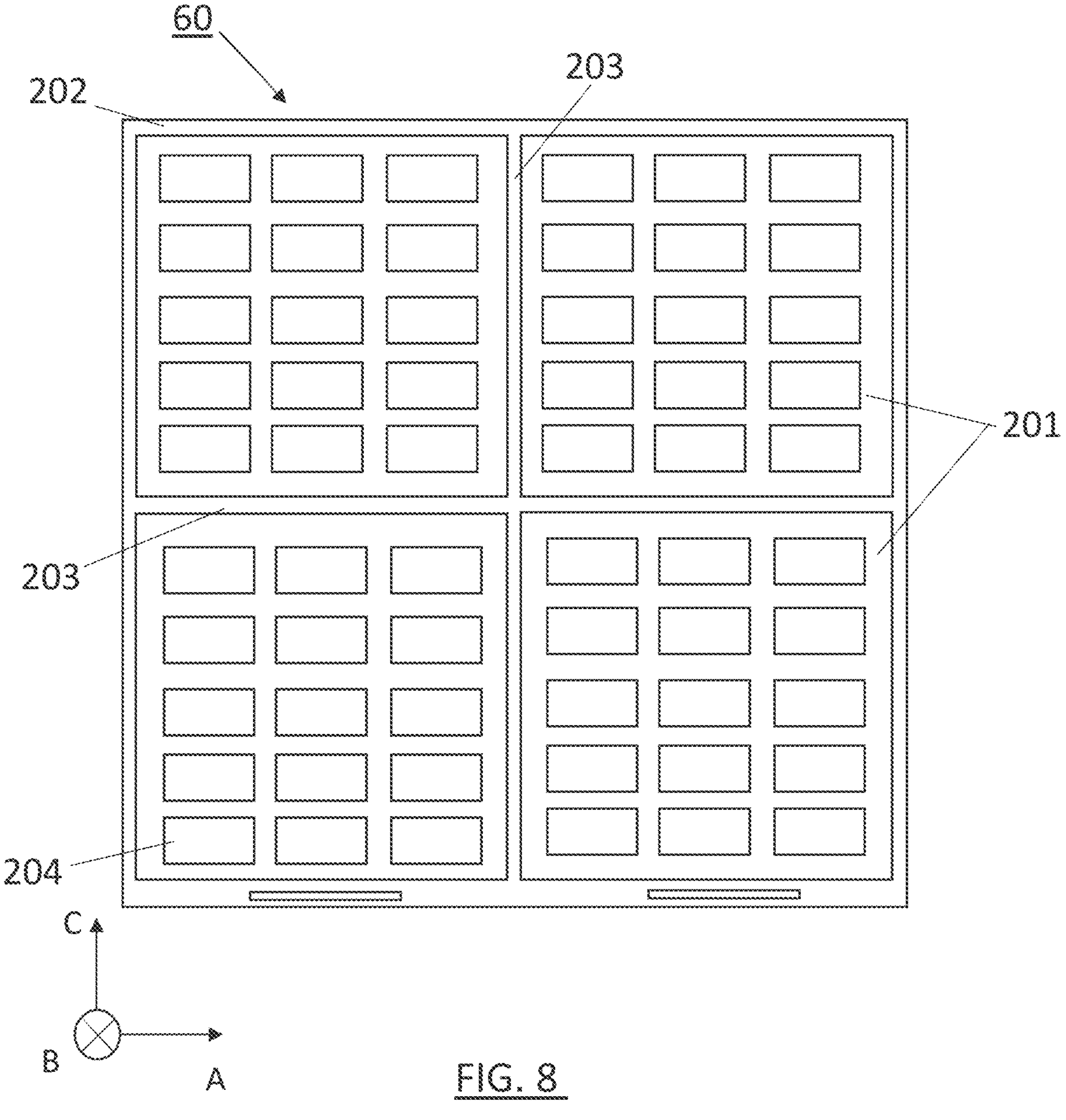
FIG. 8 schematically shows, from the back, workpiece plating and handling areas of an exemplary workpiece.

FIG. 8 shows a workpiece 60 with device areas 204 arrayed in quadrants 201, divided by a cruciform area 203 without devices. A further area 202 without devices surrounds the quadrants 201 at the edges of the workpiece 60. Areas 204 may include patterned photoresist with openings, through glass vias or other features prior to electroplating. The positioning of active areas on a workpiece is constrained by design rules, whereby panel areas are divided into areas where plating is allowed, and so-called keep-out zones (KOZ) where plating is not allowed, which as shown includes areas 202 and 203. Keep-out zones may include exclusion regions near the workpiece edges. The workpiece 60 may only be physically contacted in the narrow KOZ regions 203 and 202 to prevent particle contamination which accompanies physical contact.

Figure 9:
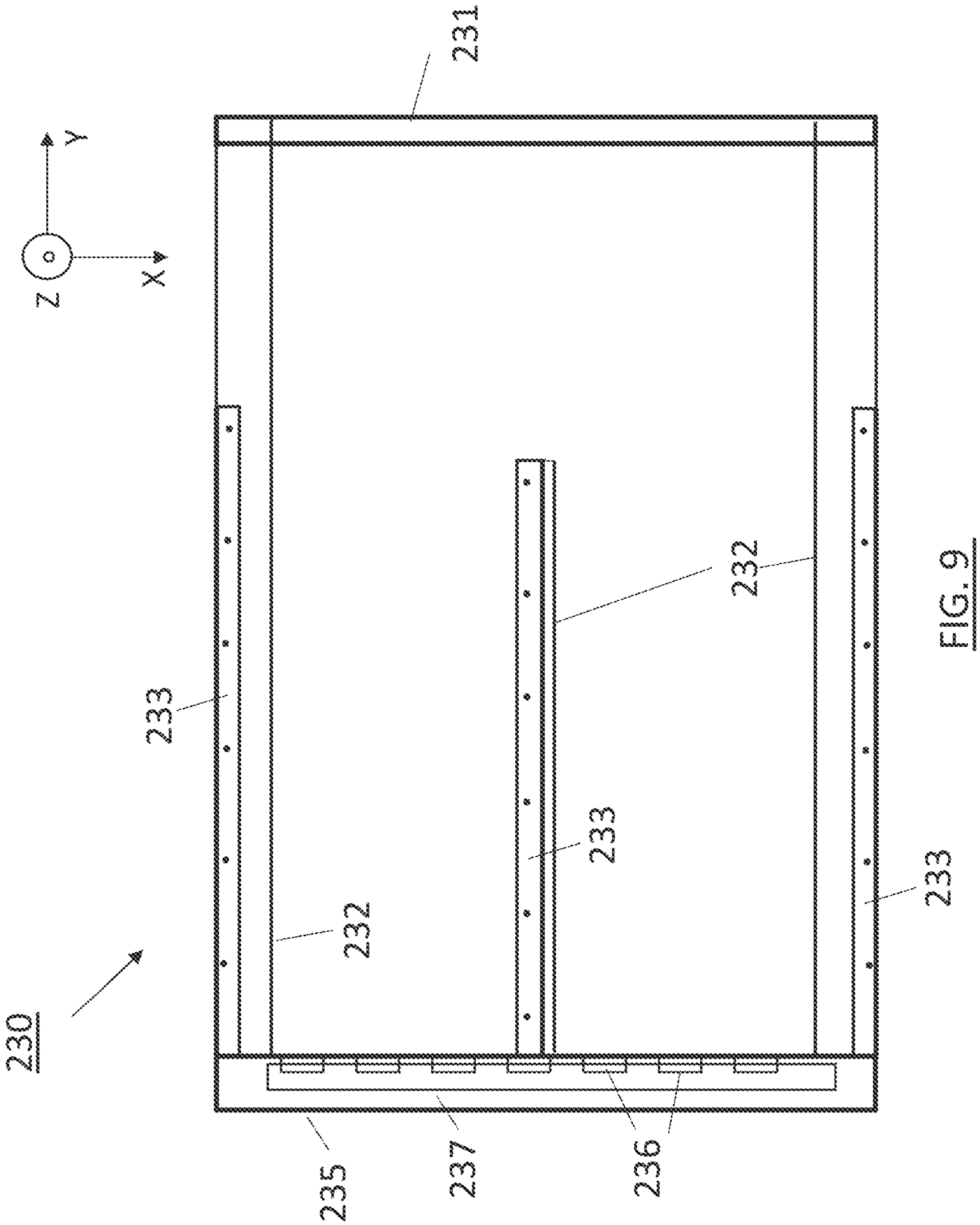
FIG. 9 schematically shows, from above, a workpiece transfer arm.
Figure 10:
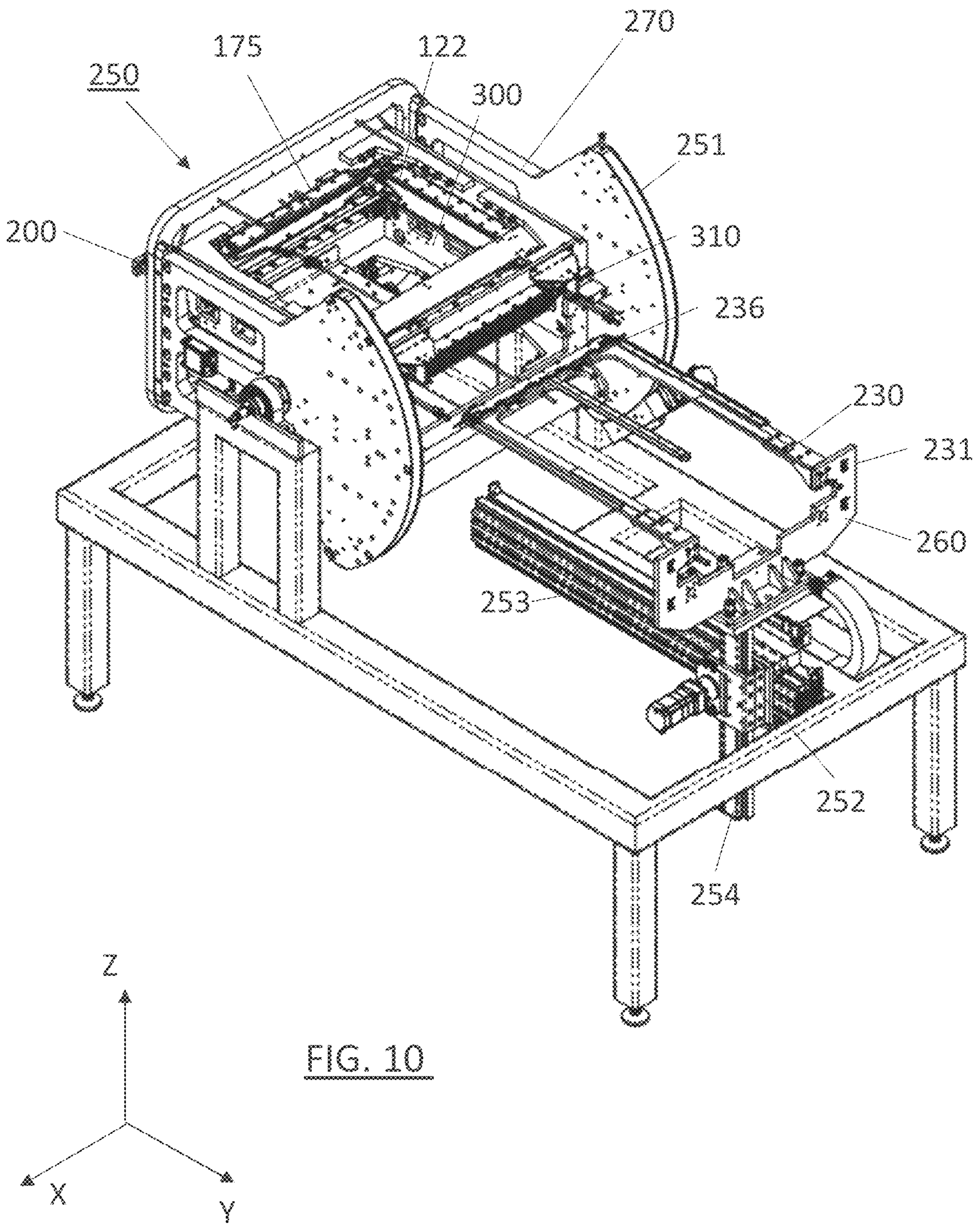
FIG. 10 schematically shows, in isometric view, a workpiece alignment and loader module in a configuration to insert a workpiece into a workpiece holder.
Figure 11:
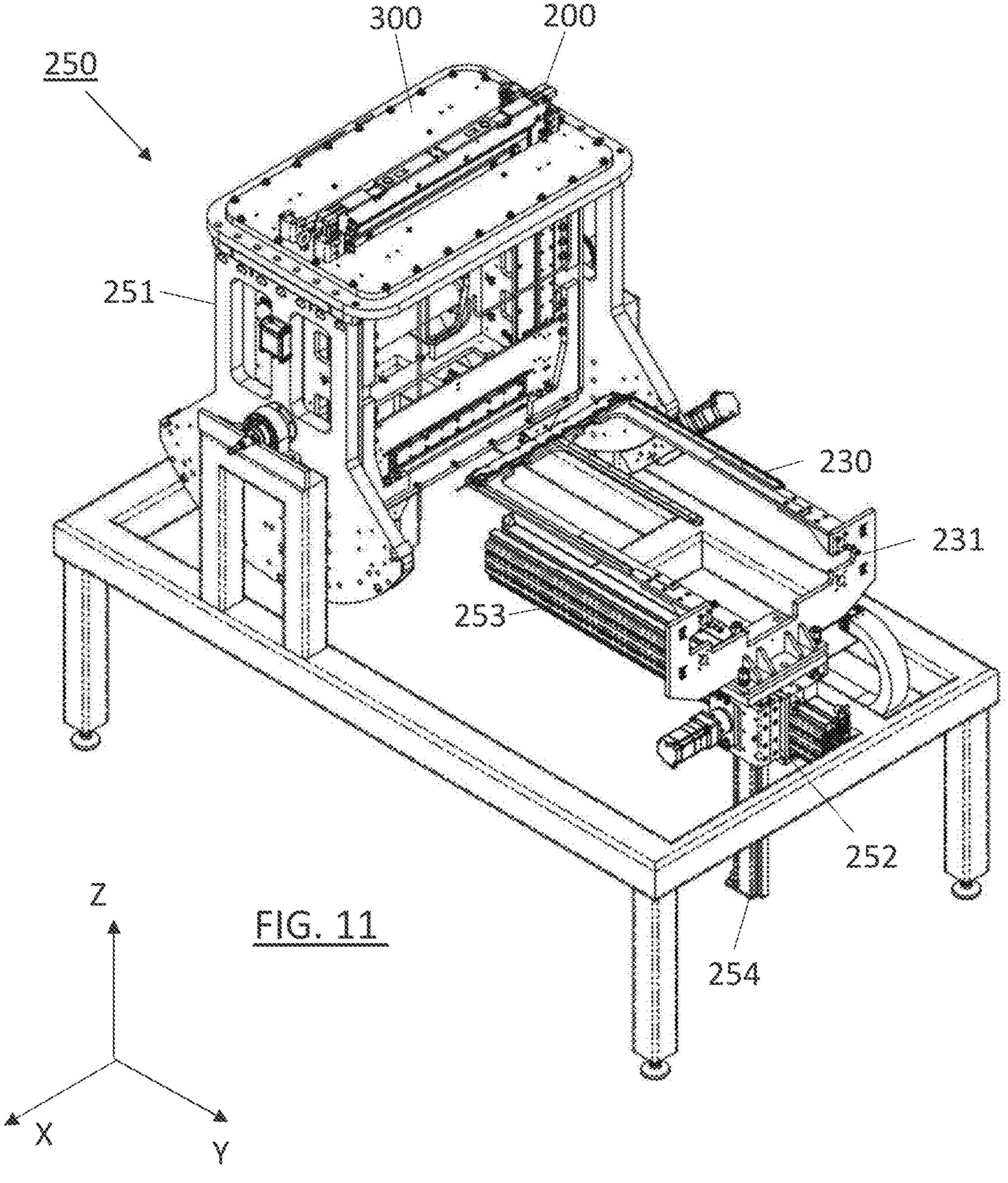
FIG. 11 schematically shows, in isometric view, the workpiece alignment and loader module of FIG. 10 in a configuration to transport workpiece holders.

FIG. 9 shows a workpiece transfer arm 230, also known as an end effector, for supporting the workpiece 60 thereon during its insertion into a workpiece holder 200 or 200', using a loader as described in more detail below. Workpiece transfer arm 230 comprises a vertical leveling plate support 231, three end effector structural beams 232 each carrying a raised contact support 233, an actuator 235 comprising a bladder 237 and clamp finger contacts 236. Gripping or releasing workpiece 60 may be accomplished by inflation or deflation of bladder 237. Alternately, gripping and releasing of workpiece 60 may use vacuum suction cups. The end effector structural beams 232 may be fabricated for example from carbon fiber or other light-weight rigid materials. The clamp finger contacts 236 are configured to clamp and unclamp the ends of workpiece 60 to flatten the leading edge when actuated by the actuator 235. The widths and spacings of the clamp finger contacts 236 are chosen to interleave with EPG guide projections 190 in use. The raised contact supports 233, which project outwardly from respective structural beams 232, contact the workpiece 60 only in KOZ regions 202 and 203. FIGS. 9 to 11 are shown with cartesian X, Y and Z axes, where the X and Y axes extend in the horizontal plane, and Z extends vertically.

FIG. 10 shows a workpiece alignment and loader module 250 in a horizontal configuration used to insert or remove a workpiece 60 from a workpiece holder 200, 200'. The alignment and loader module 250 comprises an alignment assembly 260 and a tilt loader assembly 270.

The alignment assembly 260 comprises a YZ stage 252 (which is movable along the Y and Z axes shown), the transfer arm 230, and supporting rails 253 and 254, with rail 253 extending parallel to the Y axis and enabling movement of the YZ stage 252 therealong, and rail 254 extending parallel to the Z axis and enabling movement of the YZ stage 252 therealong. The tilt loader assembly 270 comprises a tilt arm 251 and a workpiece loader 300. The YZ stage 252 is capable of positioning the transfer arm 230 in two dimensions, i.e. parallel to the Y and/or Z axes, via rails 253 and 254. The range of travel parallel to the Y axis is sufficient to move the transfer arm 230, and any workpiece 60 supported thereon, into the tilt loader assembly 270. The rails 253, 254 may for example be formed from extruded aluminum or other lightweight metal alloy. The tilt arm 251 is pivotable by means of a motor (not shown) about an axis parallel to the X axis through a rotation range of about 90 degrees, from the horizontal configuration shown in FIG. 10, through to the vertical configuration shown in FIG. 11. Also shown in FIG. 10 is the leveling plate support 231 which attaches the transfer arm 230 to the YZ stage 252, and the clamp finger contacts 236 which flatten the edge of the workpiece closest to the tilt arm 251 during insertion into a workpiece holder 200, 200' when effected by inflation of bladder 237. The alignment assembly 260 is capable of aligning a workpiece 60 on the transfer arm 230 using stepper motors (not shown) which contact the edges of the workpiece 60.

FIG. 11 shows the workpiece alignment and loader module 250, with the tilt arm 251 oriented in a vertical configuration in which a workpiece holder 200 may be inserted into, or removed from, the workpiece loader 300 by an overhead transporter (not shown). A workpiece holder 200 is inserted in one of two parallel slots (302, see FIG. 12) in the upper surface shown of the workpiece loader 300. The tilt arm 251 and workpiece loader 300 may for example be fabricated of aluminum or other lightweight metal alloy.

Figure 12:
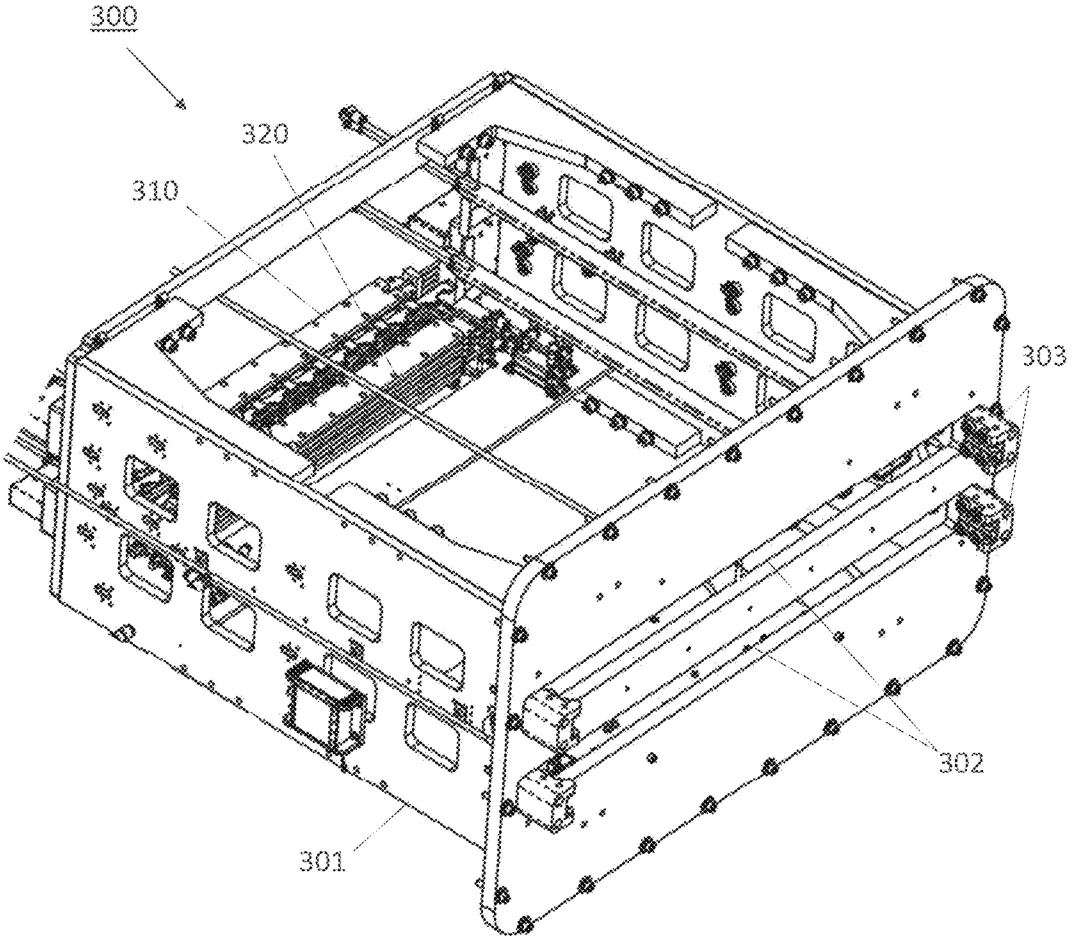
FIG. 12 schematically shows, in isometric view, a workpiece loader.

FIG. 12 shows, isolated from the rest of the alignment assembly 260, the workpiece loader 300 prior to inserting a workpiece holder 200 into one of the receiving slots 302. In this view, the workpiece loader 300 is shown rotated by 180 degrees from the orientation shown in FIG. 10. The workpiece loader 300 comprises a supporting frame 301, workpiece holder guides 303, an edge protection guide holder 310 and an interlocking assist 320. These items are described in more detail with reference to FIGS. 13 to 15 below.

Figure 13:
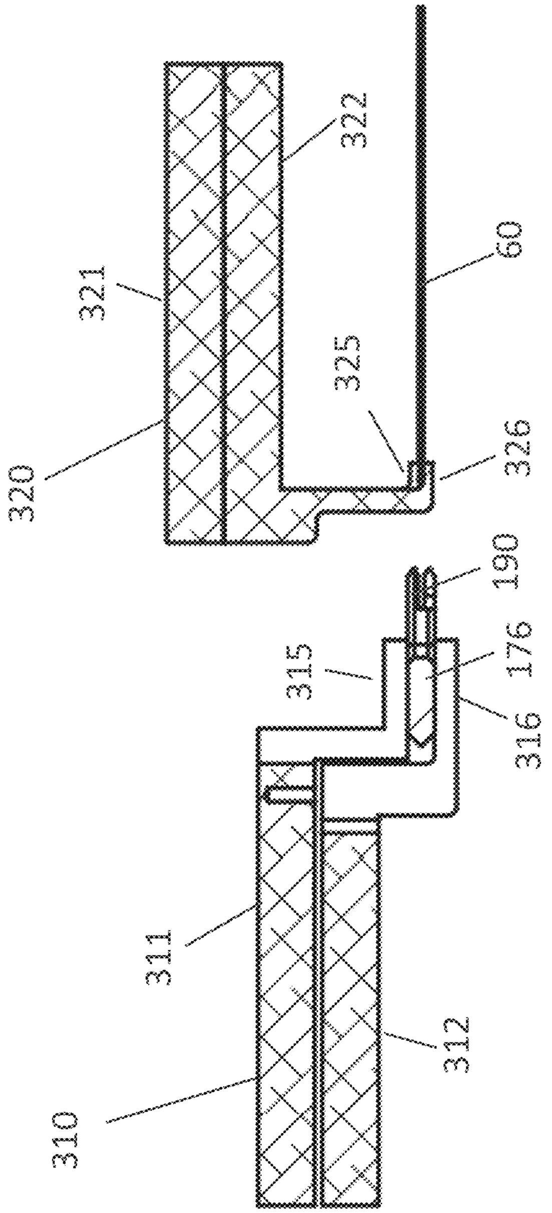
FIG. 13 shows, from the side, an edge protection guide holder and an interlocking assist.

FIG. 13 shows the edge protection guide holder 310 and interlocking assist 320. These items are used in the attachment of a lower EPG 176 to the workpiece holder 200' subsequent to loading of the workpiece. The edge protection guide holder 310 comprises a top support 311, a bottom support 312, a top clamp 315, and a bottom clamp 316. The interlocking assist 321 comprises a top support 321, bottom support 322, top fingers 325 and bottom fingers 326. Also shown in FIG. 13 is a lower EPG 176 as previously described with its guide projections 190, as well as a workpiece 60. Edge protection guide holder 310 may be actuated to grip or release lower EPG 176 using pneumatic or mechanical actuation (not shown).

Figure 14:
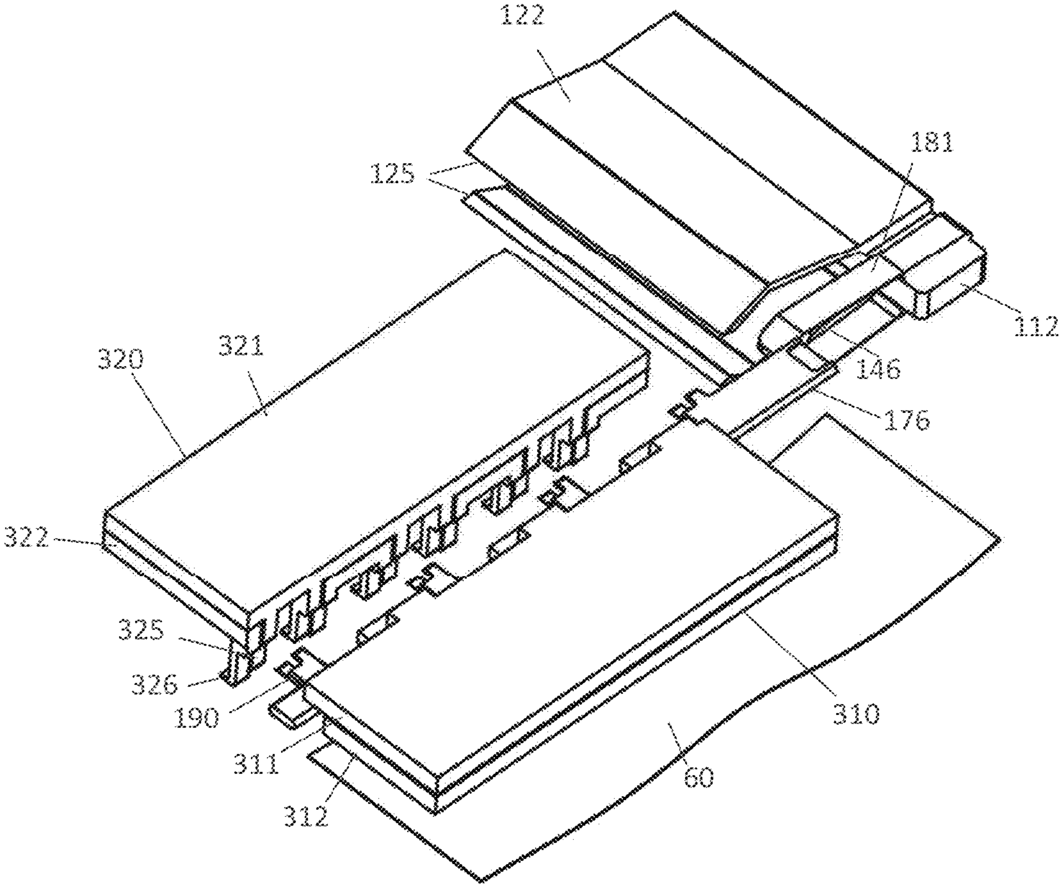
FIG. 14 schematically shows, in isometric view, an edge protection guide holder, an interlocking assist and a portion of a workpiece holder with edge protection guide prior to insertion of a workpiece into the workpiece holder.

FIG. 14 shows edge protection guide holder 310, interlocking assist 320, lower EPG 176 and workpiece 60 in a position prior to inserting workpiece 60 into lower EPG 176. Also shown in FIG. 14 are contact seal strip 122, electrical contacts 125, lateral support 112, clamp 181 and inflatable bladder 146. The contact seal strip 122 and the clamp 181 are shown in open positions consistent with inflation of the bladder 146. The edge protection holder top support 311 and bottom support 312 are shown in a closed position, gripping lower EPG 176.

Figure 15:
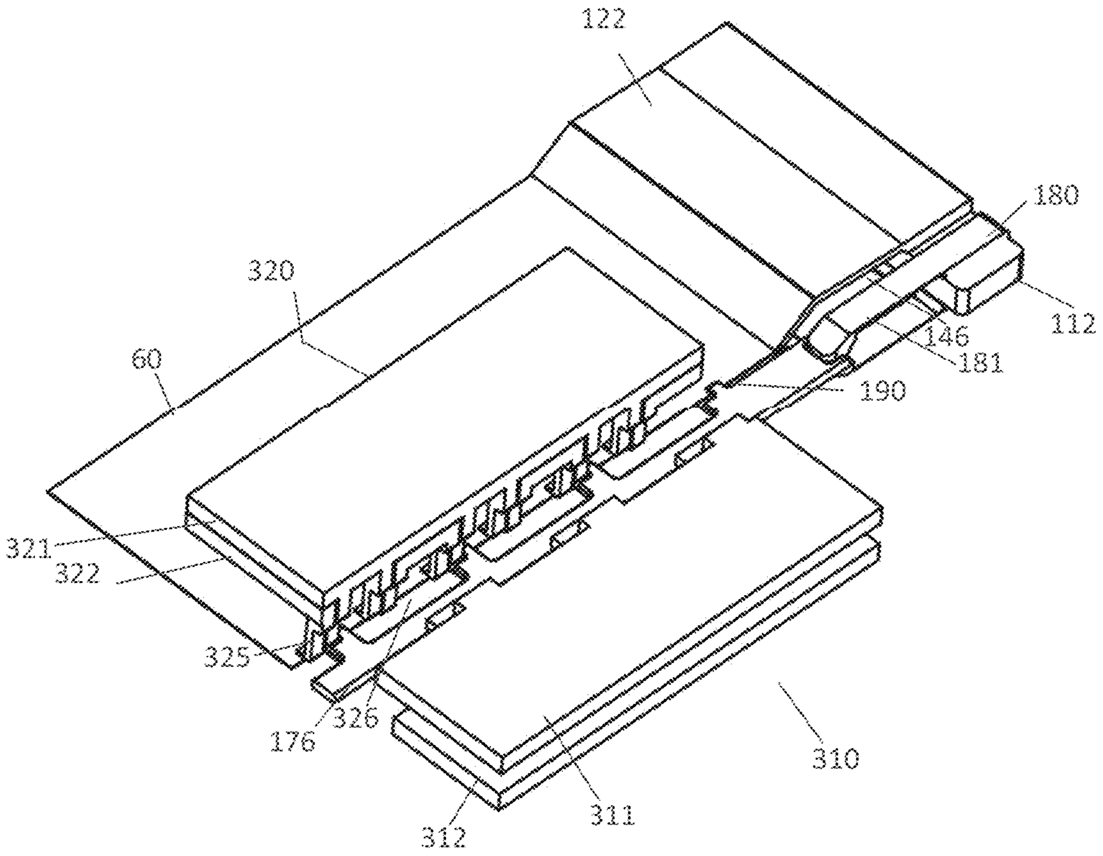
FIG. 15 schematically shows, in isometric view, an edge protection guide holder, an interlocking assist and a portion of a workpiece holder with edge protection guide after insertion of a workpiece into the workpiece holder.

FIG. 15 shows the edge protection guide holder 310, interlocking assist 320, lower EPG 176 and workpiece 60 after insertion of the workpiece 60 into lower EPG 176, by moving the workpiece transfer arm 230 parallel to the Y-axis using rail 253. The contact seal strip 122 and clamp 181 are shown in closed positions consistent with an uninflated bladder 146. Lower EPG 176 is shown clamped onto lateral support 112 and electrical contacts 125 are in contact with workpiece 60. Edge protection top clamp 311 and bottom clamp 312 are shown in open positions, after release of lower EPG 176. Interlocking assist top fingers 325 and bottom fingers 326 are in a closed position, straightening the held edge of the workpiece 60.

An exemplary method to load and process a workpiece 60 using a workpiece holder 200' in an electrochemical deposition system comprises the following steps:

1. Provide the lower EPG 176 to the EPG guide holder 310 either manually or by removal from a workpiece holder 200' not containing a workpiece 60;
2. Rotate the loader assembly 270 into the vertical orientation (shown in FIG. 11) using the tilt arm 251;
3. Using an overhead transporter, load an empty workpiece holder 200', including attached upper and lower EPGs 175, 176, into one of the slots 302 of the workpiece loader 300;
4. Rotate the loader assembly 270 into its horizontal orientation (shown in FIG. 10) using the tilt arm 251;
5. Remove an unprocessed workpiece 60 from the FOUP 69 using the EFEM Robot 70;
6. Move the YZ stage 231 to a transfer position height;
7. Place the workpiece 60 onto the end effector 230 using EFEM Robot 70;
8. Clamp workpiece 60 on end effector 230 using clamp finger contacts 236;
9. Open the edge protection guide holder 310 and interlocking assist 320;
10. Clamp the lower EPG 176 with the EPG holder 310;
11. Inflate the bladders 146;
12. Remove the lower EPG 176 from the workpiece holder 200;
13. Insert the workpiece 60 into the interlocking assist 320 using the transfer arm 230;
14. Clamp and straighten edge of the workpiece 60 with the interlocking assist 320;
15. Insert the clamped and straightened workpiece 60 into the lower EPG 176 by moving the transfer arm 230;
16. Deflate the bladders 146 and thus secure the workpiece 60 within the workpiece holder 200';
17. Unclamp the EPG holder 310;
18. Decouple the transfer arm 230 from the workpiece 60;
19. Move the transfer arm 230 out of the loader assembly 270;
20. Rotate the loader assembly 270 to its vertical orientation using the tilt arm 251;
21. Transport the loaded workpiece holder 200 to a pre-process module 54 using an overhead transporter.

Figure 16A:
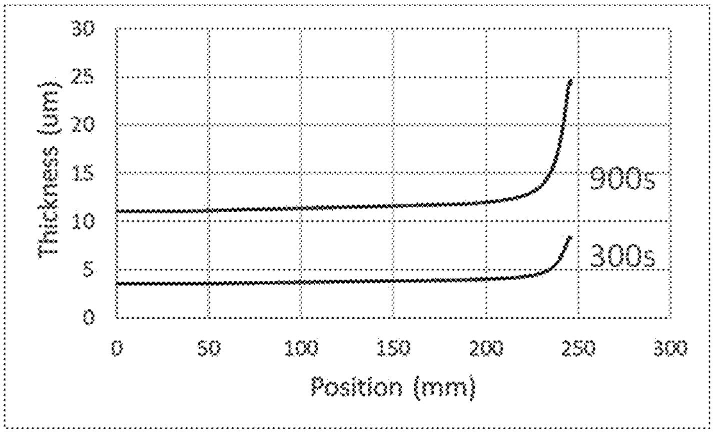
FIGS. 16A, 16B and 16C show deposition profiles for a known four-sided workpiece holder and the workpiece holder with edge protection guides of the current application with FIG. 16A showing deposition profiles for a known workpiece holder with four-sided electrical contact, FIG. 16B showing deposition profiles of a workpiece holder with upper and lower EPGs, and FIG. 16C showing deposition profiles for a workpiece holder with upper and lower EPGs and a shield.
Figure 16B:
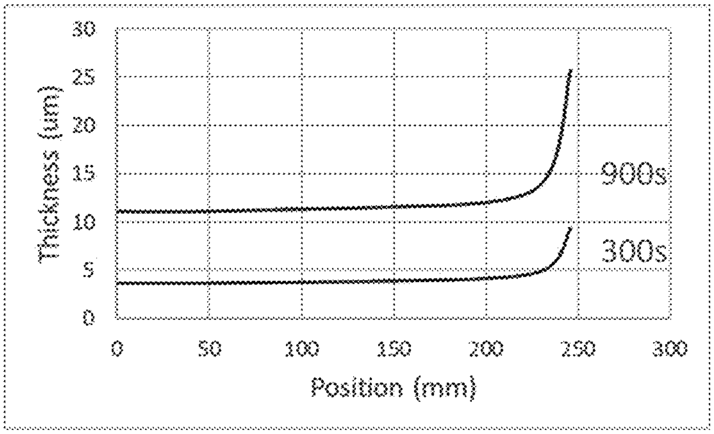
Figure 16C:
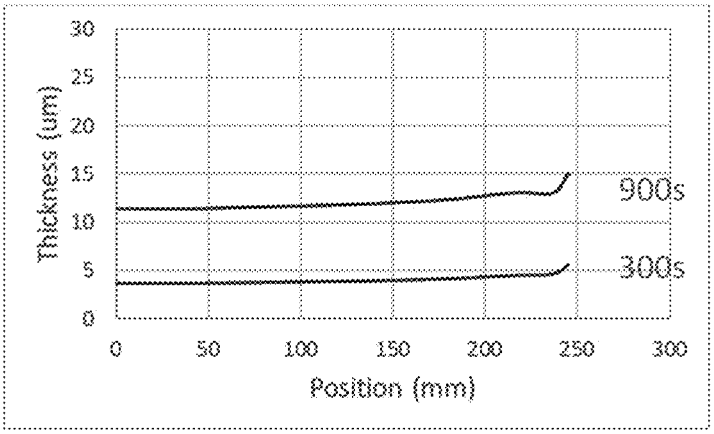

FIGS. 16A to 16C show deposition profiles for: a known workpiece holder with four-sided electrical contact (FIG. 16A), a workpiece holder 200' with upper and lower EPGs 175, 176 (FIG. 16B), and a workpiece holder 200 with upper and lower EPGs 175, 176 and a shield (FIG. 16C). The profiles show copper deposition thickness in um for the plating cell geometry of the P500 ECD Panel Tool available from ASMPT NEXX of Billerica, MA, calculated using the electrodeposition module of COMSOL Multiphysics, available from COMSOL Inc. of Burlington, MA. Simulation parameters include an initial copper seed thickness of about 100 nm, a plating rate of about 3.6 amps per square decimeter and a target deposition thickness of 12 um for a workpiece of dimensions about 510×515 mm. Each graph shows the deposition thickness along a diagonal cross section, where the position in mm is the distance from the center of the workpiece to a corner. The curves in each graph show the thickness after times of 300 and 900 s.

One cause of the non-uniformity in FIGS. 16A-C is the terminal effect, which causes increased plating near the edges due to the potential drop in the seed layer and plated film across the workpiece. A second cause of non-uniformity is seen at the corners of rectangular workpieces. This non-uniformity is present whether electrical contact is made approaching the corner along one or both edges of the workpiece. This is an unexpected finding related to the electric field distribution on the face of a workpiece when current flows near a corner. This result differs from a round workpiece, in which surrounding the workpiece with electrical contacts provides the optimum uniformity.

Table 1 lists the standard deviation of the deposition profiles in FIGS. 16A-C. The baseline uniformity of the four-sided workpiece holder and workpiece holder 200 with EPG 176 are similar. In order to further improve the plating uniformity, additional shielding such as close shield 71 may be used. The thin profile of EPG 175 allows for the placement of a shield 71 as close as around 2-10 mm from the workpiece, a configuration not possible using known four-sided workpiece holders.

TABLE 1

The standard deviation of deposition uniformity along a diagonal from the workpiece center to a corner as a function of time for each curve shown in FIGs. 16A-C.

| Holder Configuration | Time (s) | Uniformity |
|---|---|---|
| Four sided contacts (FIG. 16A) | 300 | 14.2% |
| | 900 | 12.5% |
| Workpiece Holder 200 (FIG. 16B) | 300 | 13.3% |
| | 900 | 11.9% |
| Holder 200 with shield (FIG. 16C) | 300 | 6.3% |
| | 900 | 3.9% |

The results shown in FIGS. 16A-C and Table 1 suggest that a plating system incorporating a workpiece holder which protects the four edges of a workpiece while providing electrical contact along two edges may have advantages compared with holders which provide contact along all four edges.

The invention claimed is:

1. A workpiece holder for holding a substantially planar, quadrilateral workpiece in a processing chamber of a wet semiconductor processing system, the workpiece holder being adapted for insertion into and removal from the processing chamber while holding the workpiece, wherein the workpiece holder comprises:

first and second lateral supports, first and second flexing grippers arranged at respective first and second lateral supports, the flexing grippers movable between a closed configuration in which they contact and restrain respective first and second opposing edges of the workpiece in use, and an open configuration in which the flexing grippers are opened sufficiently to allow the workpiece to be inserted into the flexing grippers in a direction substantially parallel to the first and second lateral supports during a loading operation, and an edge protector extending in use between the first and second lateral supports.

2. The workpiece holder of claim 1, wherein the first and second flexing grippers comprise electrical contacts for applying electrical current to respective first and second opposing edges of the workpiece in use.

3. The workpiece holder of claim 1, where the edge protector comprises an elongate U-shaped channel for receiving the workpiece in use.

4. The workpiece holder of claim 3, comprising a plurality of guiding projections positioned along the length of the U-shaped channel, on each opposing side of the U-shaped channel, to guide the workpiece into the U-shaped channel during the loading operation.

5. The workpiece holder of claim 4, where the guiding projections positioned on a first side of the U-shaped channel interleave with the guiding projections positioned on a second, opposing, side of the U-shaped channel along the length of the U-shaped channel.

6. The workpiece holder of claim 1, wherein the edge protector is insulative so that no current is supplied to the workpiece via the edge protector in use.

7. The workpiece holder of claim 6, where the edge protector is fabricated from a thermoplastic selected from the group comprising high-density polyethylene and polyetheretherketone.

8. The workpiece holder of claim 6, where the edge protector is fabricated from stainless steel coated with a fluorinated polymer selected from the group comprising Viton, polytetrafluoroethylene and ethylene chlorotrifluoroethylene.

9. The workpiece holder of claim 1, comprising a header member connecting the first and second lateral supports, the arrangement being such that in use, the header member and the first and second lateral supports surround three edges of the workpiece.

10. The workpiece holder of claim 9, wherein the edge protector is arranged parallel to the header member and proximate thereto.

11. The workpiece holder of claim 9, wherein the edge protector is arranged parallel to the header member and spaced therefrom, the arrangement being such that in use, the header member, the first and second lateral supports and the edge protector surround all four edges of the workpiece.

12. The workpiece holder of claim 10, comprising a second edge protector, the second edge protector being arranged parallel to the header member and spaced therefrom, the arrangement being such that in use, the first edge protector, the first and second lateral supports and the second edge protector surround all four edges of the workpiece.

13. A semiconductor processing system for processing a substantially planar, quadrilateral workpiece while loaded into the workpiece holder of claim 1, the system comprising:

a processing chamber for wet chemical etch, cleaning or electrodeposition, and a workpiece loader for loading the workpiece into the workpiece holder during the loading operation.

14. The semiconductor processing system of claim 13, wherein the loader comprises a contact portion configured to contact the workpiece at a periphery of the workpiece.

15. The semiconductor processing system of claim 13, wherein the loader comprises edge clamps for straightening the workpiece during loading into the workpiece holder.

16. The semiconductor processing system of claim 13, when loaded with the workpiece holder of claim 4, wherein the edge clamps interleave with the guiding projections.

* * * * *